(12) United States Patent
Iwasaki

(10) Patent No.: US 7,906,780 B2
(45) Date of Patent: Mar. 15, 2011

(54) FIELD EFFECT TRANSISTOR

(75) Inventor: Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 109 days.

(21) Appl. No.: 12/097,850

(22) PCT Filed: Jan. 11, 2007

(86) PCT No.: PCT/JP2007/050626
§ 371 (c)(1),
(2), (4) Date: Jun. 17, 2008

(87) PCT Pub. No.: WO2007/086291
PCT Pub. Date: Aug. 2, 2007

(65) Prior Publication Data
US 2009/0174012 A1    Jul. 9, 2009

(30) Foreign Application Priority Data
Jan. 30, 2006   (JP) ................... 2006-020983

(51) Int. Cl.
H01L 29/04    (2006.01)
H01L 31/20    (2006.01)
H01L 29/45    (2006.01)
H01L 29/786   (2006.01)

(52) U.S. Cl. ........ 257/59; 257/52; 257/57; 257/E29.145; 257/E29.273

(58) Field of Classification Search ................. 257/347, 257/52, 59, 57, E29.145, E29.273
See application file for complete search history.

(56) References Cited

U.S. PATENT DOCUMENTS

| | | | |
|---|---|---|---|
| 4,416,952 A | 11/1983 | Nishizawa et al. | 428/698 |
| 5,593,335 A | 1/1997 | Suzuki et al. | 445/50 |
| 6,160,347 A | 12/2000 | Iwasaki et al. | 313/545 |
| 6,231,412 B1 | 5/2001 | Kawade et al. | 445/3 |
| 6,283,815 B1 | 9/2001 | Iwasaki et al. | 445/41 |
| 6,563,174 B2 | 5/2003 | Kawasaki et al. | 257/350 |
| 6,936,854 B2 | 8/2005 | Iwasaki et al. | 257/81 |
| 6,970,610 B2 | 11/2005 | Iwasaki | 385/114 |
| 6,989,556 B2 * | 1/2006 | Braddock | 257/192 |
| 7,411,209 B2 | 8/2008 | Endo et al. | 257/43 |

(Continued)

FOREIGN PATENT DOCUMENTS

JP        5-251705        9/1993

(Continued)

OTHER PUBLICATIONS

Nomura, K. et al., "Room-temperature fabrication of transparent flexible thin-film transistors using amorphous oxide semiconductors", Nature Publishing Group, Nature, vol. 432, Nov. 25, 2004, pp. 488-492.

(Continued)

Primary Examiner — Luan C Thai
(74) Attorney, Agent, or Firm — Fitzpatrick, Cella, Harper & Scinto

(57) ABSTRACT

Provided is a field effect transistor, provided with a gate electrode 15, a source electrode 13, and a drain electrode 14 formed on a substrate, including a channel layer 11 formed of an oxide containing In, Zn, or Sn as the main component, and a gate insulating layer 12 provided between the channel layer 11 and the gate electrode 15, in which the gate insulating layer 12 is formed of an amorphous oxide containing Ga as the main component.

7 Claims, 4 Drawing Sheets

U.S. PATENT DOCUMENTS

| | | | |
|---|---|---|---|
| 2003/0047785 A1 | 3/2003 | Kawasaki et al. | 257/350 |
| 2005/0173734 A1 | 8/2005 | Yoshioka et al. | 257/202 |
| 2005/0269634 A1 | 12/2005 | Bojarczuk, Jr. et al. | 257/338 |
| 2006/0043410 A1 | 3/2006 | Iwasaki et al. | 257/103 |
| 2006/0189083 A1* | 8/2006 | Saenger et al. | 438/275 |
| 2007/0158765 A1* | 7/2007 | Ahn et al. | 257/410 |
| 2007/0194379 A1* | 8/2007 | Hosono et al. | 257/347 |

FOREIGN PATENT DOCUMENTS

| | | |
|---|---|---|
| JP | 2000-44236 | 2/2000 |
| JP | 2001-320054 A | 11/2001 |
| JP | 2003-86808 | 3/2003 |
| JP | 2004-103957 | 4/2004 |
| JP | 2005-268507 A | 9/2005 |
| WO | WO 2005/088726 A1 | 9/2005 |
| WO | WO 2005/093848 A1 | 10/2005 |
| WO | WO 2005/093850 A1 | 10/2005 |
| WO | WO 2005/093851 A1 | 10/2005 |

OTHER PUBLICATIONS

Fortunato, E. et al., "Wide-bandgap high-mobility ZnO thin-film transistors produced at room temperature", American Institute of Physics, Appl. Phys. Lett., vol. 85, No. 13, Sep. 27, 2004, pp. 2541-2543.

Shibuya K. et al., "Single crystal $SrTiO_3$ field-effect transistor with an atomically flat amorphous $CaHfO_3$ gate insulator", American Institute of Physics, Appl. Phys. Lett., vol. 85, No. 3, Jul. 19, 2004, pp. 425-427.

Heo, Y.W. et al., "Depletion-mode ZnO nanowire field-effect transistor", American Institute of Physics, Appl. Phys. Lett., vol. 85, No. 12, Sep. 20, 2004, pp. 2274-2276.

Kwon, Y. et al., "Enhancement-mode thin-film field-effect transistor using phosphorus-doped (Zn,Mg)O channel", American Institute of Physics, Appl. Phys. Left., vol. 84, No. 14, Apr. 5, 2004, pp. 2685-2687.

Fortunato, E. et al., "High field-effect mobility zinc oxide thin film transistors produced at room temperature", Journal of Non-Crystalline Solids 338-340 (2004), pp. 806-809.

Carcia, P.F. et al., "Transparent ZnO thin-film transistor fabricated by rf magnetron sputtering", American Institute of Physics, Appl. Phys. Lett., vol. 82, No. 7, Feb. 17, 2003, pp. 1117-1119.

Hoffman, R.L. et al., "ZnO-based transparent thin-film transistors", American Institute of Physics, Appl. Phys. Lett., vol. 82, No. 5, Feb. 3, 2003, pp. 733-735.

Nishii, J. et al., "High Mobility Thin Film Transistors with Transparent ZnO Channels", The Japan Society of Applied Physics, Jpn. J. Appl. Phys., vol. 42, Part 2, No. 4A, Apr. 2003, pp. L347-L349.

Ohya, Y., "Thin Film Transistor of ZnO Fabricated by Chemical Solution Deposition", Japan Society of Applied Physics, Jpn. J. Appl. Phys., vol. 40, Part 1 No. 1 Jan. 2001, pp. 297-298.

Yabuta, H. et al., "High-mobility thin-film transistor with amorphous $InGaZnO_4$ channel fabricated by room temperature rf-magnetron sputtering", American Institute of Physics, Appl. Phys. Left., vol. 89, 2006, pp. 112123-1 to 112123-3.

Takagi, A. et al., "Carrier transport and electronic structure in amorphous oxide semiconductor, in a-$InGaZnO_4$", Thin Solid Films, 2005, pp. 38-41.

Nomura, K. et al., "Carrier transport of extended and localized states in $InGaO_3 (ZnO)_5$", Mat. Res. Soc. Symp. Proc., vol. 811, 2004, pp. E2.9.1-E2.9.6.

* cited by examiner

FIELD EFFECT TRANSISTOR

This Application is a National Stage filing under 35 U.S.C. §371 of International Application No. PCT/JP2007/050626, filed Jan. 11, 2007.

TECHNICAL FIELD

The present invention relates to a field effect transistor, and more particularly to a field effect transistor having a gate insulating layer formed of an amorphous oxide film and being applicable to a display device or the like.

BACKGROUND ART

A field effect transistor (FET) is a three-terminal device having a gate electrode, source electrode, and a drain electrode.

The field effect transistor is an electronic active device in which voltage is applied to a gate electrode, a current flowing through a channel layer is controlled to switch the current between a source electrode and a drain electrode.

In particular, an FET which uses as a channel layer a thin film formed on an insulating substrate formed of ceramic, glass, plastic, or the like is called a thin film FET (thin film transistor, TFT).

The above-mentioned TFT has an advantage of being easily formed on a substrate having a relatively large area because the TFT is manufactured using thin film technology, and is widely used as a driving device in a flat panel display device such as a liquid crystal display device.

More specifically, in an active liquid crystal display device (ALCD), TFTs formed on a glass substrate are used to turn on/off individual image pixels.

Also, in a prospective high performance organic LED display (OLED), it is expected that current drive of pixels using TFTs is effective.

Further, a higher performance liquid crystal display device has been materialized in which a TFT circuit having a function of driving and controlling the whole image is formed on a substrate adjacent to an image display region.

The TFT most generally used now is a Metal-Insulator-Semiconductor Field Transistor (MIS-FET) device. This device uses a polycrystalline silicon film or an amorphous silicon film as the material of a channel layer.

These days, oxide materials receive attention as materials applicable to a TFT channel layer.

For example, development of TFTs which use as a channel layer a polycrystalline thin film of a transparent conductive oxide using ZnO as the main component is actively made.

The above-mentioned thin film can be formed at a relatively low temperature, and thus, the thin film can be formed on a substrate such as a plastic plate and a film.

However, due to scattering at the interface of polycrystalline particles, the electron mobility can not be made high.

Further, because the shape and interconnection of the polycrystalline particles greatly differ depending on the method of forming the film, the characteristics of the TFT device vary.

Further, K. Nomura et al., Nature 432, 488 (2004) reports a thin film transistor using an In—Ga—Zn—O-based amorphous oxide.

This transistor can be formed on a plastic or glass substrate at room temperature.

Further, normally-off transistor characteristics with a field effect mobility of approximately 6-9 have been obtained.

Further, this transistor is characterized by being transparent to visible light.

As a gate insulating layer of a thin film transistor, $SiO_2$, $SiN_x$, or the like is generally used.

With regard to a transistor which uses an oxide for a channel layer as well, use of those gate insulating layers is under consideration.

On the other hand, as a conventional transistor having a gate insulating film containing Ga as the main component, Japanese Patent Application Laid-open No. 2005-268507 discloses an FET using GaN as a channel layer.

However, this prior art uses a nitrogen compound excellent in crystallinity for the channel layer.

Japanese Patent Application Laid-open No. 2003-086808 discloses that in a TFT using crystalline ZnO as a channel layer, $LiGaO_2$ or $(Ga_{1-z}Al_z)O_2$ is used as an insulating layer.

However, the insulating layer described in Japanese Patent Application Laid-open No. 2003-086808 is a crystalline thin film, and, from the viewpoint of lattice matching between the channel layer and the insulating layer, materials for the respective layers are selected.

By the way, with regard to a thin film transistor using an In—Ga—Zn—O-based amorphous oxide, attempts are being made to materialize a thin film transistor having a large ON current by using a gate insulating layer having a high permittivity such as $HfO_2$ or $Y_2O_3$.

DISCLOSURE OF THE INVENTION

However, with those gate insulating layers, it is difficult to attain both satisfactory transistor characteristics and operation stability.

One reason is thought to be that, with those gate insulating layers, it is difficult to form a satisfactory interface between the gate insulating layer and the channel layer.

Here, the satisfactory transistor characteristics include obtaining a large ON current and a small OFF current.

Also, the satisfactory transistor characteristics include a high field-effect mobility and being normally off.

The operation stability includes small hysteresis, stability over time, stability over drive history, and stability against environmental change.

In review of a thin film transistor using an amorphous In—Ga—Zn—O-based oxide as a channel layer, depending on the composition, manufacturing conditions, and the like, there are cases where hysteresis is generated in transistor characteristics (Id-Vg characteristics) of the TFT.

When the TFT is used in, for example, a pixel circuit of a display, generation of hysteresis creates variations in operation of an organic LED, liquid crystal, or the like to be driven, which ultimately leads to degraded image quality of the display. Accordingly, an object of the present invention is to materialize a thin film transistor which attains both satisfactory transistor characteristics and operation stability.

Another object of the present invention is to decrease the above-mentioned hysteresis and to improve drive stability of a thin film transistor using an oxide as a channel layer by modifying an oxide material used for a gate insulating layer.

According to the present invention, there is provided a field effect transistor, provided with a gate electrode, a source electrode, and a drain electrode, including: a channel layer formed of an oxide semiconductor containing at least one selected from the group consisting of In, Zn, and Sn; and a gate insulating layer arranged between the channel layer and the gate electrode, in which the gate insulating layer comprises an amorphous oxide containing Ga as a main component.

BEST MODE FOR CARRYING OUT THE INVENTION

Figure 1:
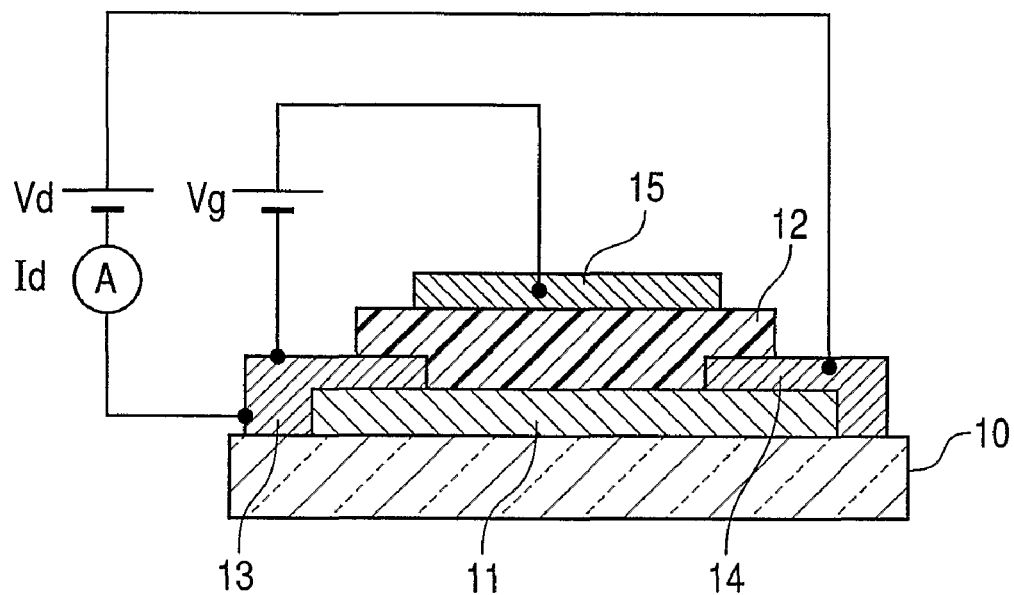
FIG. 1 is a sectional view illustrating an exemplary structure of a field effect transistor according to an embodiment of the present invention.

The best mode for carrying out the present invention is described in detail in the following with reference to the attached drawings.

A field effect transistor according to an embodiment of the present invention is a field effect transistor having a channel layer formed of an oxide including at least one selected from the group consisting of In, Zn, and Sn such as indium oxide, zinc oxide, and tin oxide, in which a gate insulating layer includes an amorphous oxide containing Ga as the main component.

Above all, the gate insulating layer is required to have a high insulating property (high resistivity and high dielectric strength).

A high insulating property makes it possible to materialize a transistor having a small gate leak current (current flowing between a source and a gate or between a drain and a gate).

Further, if a TFT has a high insulating property, the film thickness of the insulating layer can be made thin, so a high performance transistor can be materialized.

Using an insulating material having such a high insulating property enables drive at high voltage, and realizes a highly reliable device against overvoltage.

Further, it is preferable that the material forming the gate insulating layer has a high permittivity.

Having a high permittivity makes it possible to materialize a transistor having a large ON current.

Further, it is desirable that the material forming the gate insulating layer, when used in a TFT, is desired to provide a device exhibiting small hysteresis or a device with small change over time.

In this regard, it is preferable that charge is hard to be trapped in the insulating film.

In addition, it is preferable that a satisfactory interface is formed between the gate insulating layer and the channel layer.

By using an amorphous oxide containing Ga as the main component for the insulating layer, a high insulating property and a relatively high permittivity can be materialized.

For example, a thin film of amorphous $Ga_2O_3$ has a relatively high permittivity of approximately 9 and dielectric strength of approximately 4 MV/cm can be materialized, which is preferable.

Further, by using this structure for the gate insulating layer of the TFT, stable device characteristics can be obtained.

It is thought that, because of the amorphous state, a flat thin film can be manufactured, and there is no charge trap at the crystal grain boundary, and thus, stable device characteristics can be obtained.

In particular, it is preferable to use a gate insulating layer containing Ga as the main component with a channel layer formed of an amorphous oxide containing In, Zn, or Sn as the main component.

A TFT having such channel layer as described above can materialize, in particular, a TFT exhibiting small hysteresis and excellent stability over time.

The reason is uncertain, but may be that a satisfactory interface is formed between the oxide semiconductor containing In, Zn, or Sn as the main component and the oxide insulator containing Ga as the main component, and thus, charge is hard to be trapped at the interface.

Another reason may be that, when interdiffusion of atoms (Ga, etc.) is caused between the insulating layer and the channel layer, the effect thereof on the transistor characteristics is small.

Still another reason may be that, when Ga is diffused, the amorphous channel layer is not crystallized, and the stable amorphous structure is maintained.

Figure 2:
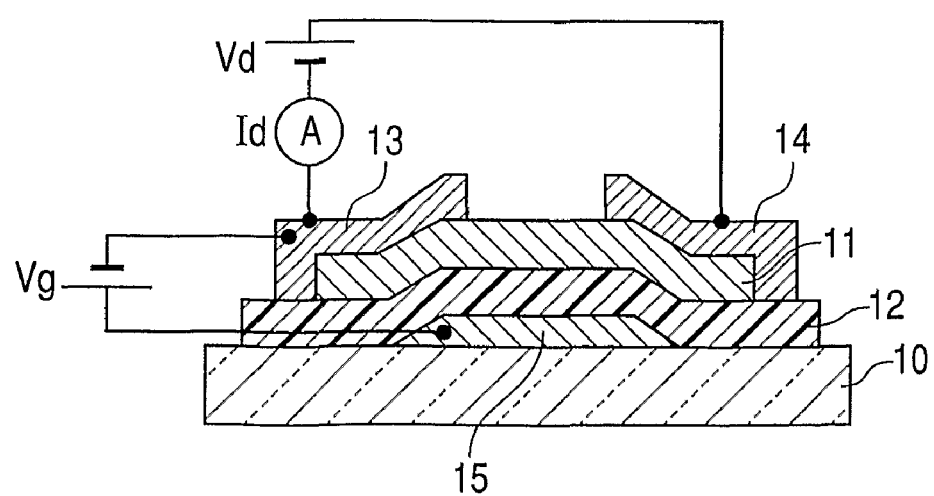
FIG. 2 is a sectional view illustrating another exemplary structure of the field effect transistor according to the embodiment of the present invention.

FIG. 1 and FIG. 2 are sectional views of exemplary structures of field effect transistors according to embodiments of the present invention.

FIG. 1 illustrates an exemplary staggered structure.

In FIG. 1, reference numerals 10, 11, 12, 13, 14, and 15 denote a substrate, a channel layer, an insulating layer, a source electrode, a drain electrode, and a gate electrode, respectively.

The field effect transistor is a three-terminal device having the gate electrode 15, the source electrode 13, and the drain electrode 14.

The field effect transistor is an electronic active device which has a function of applying voltage Vg to the gate electrode, controlling a current Id flowing through the channel layer, and switching the current Id between the source electrode and the drain electrode.

FIG. 1 illustrates an exemplary top-gate structure in which a gate insulating film 12 and the gate electrode 15 are formed in this order on a semiconductor channel layer 11.

FIG. 2 illustrates an exemplary inverted staggered structure.

Like numerals are used to designate like or identical members illustrated in FIG. 1.

FIG. 2 illustrates an exemplary bottom gate structure in which the gate insulating film 12 and the semiconductor channel layer 11 are formed in this order on the gate electrode 15.

The structure of the TFT is not limited to the ones in the present embodiment, and an arbitrary top/bottom gate structure or staggered/planar structure may be used.

The terms "staggered structure" and "planar structure" are derived from the positional relationship between the electrode and the interface between the channel layer and the insulating layer.

(Gate Insulating Layer)

The material of the gate insulating layer 12 may be any amorphous oxide containing Ga as the main component.

Exemplary amorphous oxides containing Ga as the main component include $Ga_2O_3$, Ga—In—O, Ga—Zn—O, Ga—Zn—O, Ga—In—Zn—O, Ga—Al—O, Ga—Si—O, Ga—Hf—O, and Ga—Ti—O.

In the present invention, "containing a component (element) as the main component" means that the element is contained in the largest amount among elements except oxygen.

It follows that, in the above description, "containing Ga as the main component" means that the Ga element is contained in the largest amount among elements except oxygen.

Further, "containing an element as the sub component" means that the element is contained in the third largest amount after oxygen and the main component element.

In a transistor, because the properties of the interface between the gate insulating layer and the channel layer greatly contribute to the characteristics, the combination of the material of the gate insulating layer and the material of the channel layer is important.

In this regard, in particular, a combination of a channel layer containing In as the main component and a gate insulating layer containing Ga as the main component is preferable.

In addition, a combination of a channel layer containing In as the main component and a gate insulating layer containing Ga as the main component and containing In as the sub component is another preferable example.

As described above, those combinations of a gate insulating layer material and a channel layer material are preferable because of formation of a satisfactory interface.

Combinations of a gate insulating layer and a channel layer as described above make it possible to materialize a thin film transistor with excellent TFT characteristics such as a high on/off ratio and high saturation current and with excellent drive stability in terms of small hysteresis and so on.

In addition, it is also preferable that the amorphous oxide containing Ga as the main component contains Ti, Hf, Zr, Y, La, Nb, or Ta as the sub component.

This is because the sub component as described above can make an insulating layer having a high permittivity.

This can materialize a thin film transistor having a relatively large ON current.

The gate insulating layer may be formed by laminating a plurality of insulating films.

For example, an amorphous oxide containing Ga as the main component may be laminated on an ordinary insulating layer such as $SiO_2$ or $SiN_x$.

The gate insulating film formed of an amorphous oxide is preferably formed by a vapor phase method such as sputtering (SP), pulse laser deposition (PLD), electron beam deposition, and atomic layer deposition.

It is to be noted that, among vapor deposition methods, the SP is appropriate from the viewpoint of mass production.

However, the method of forming the film is not limited to those. The temperature of the substrate when the film is formed can be maintained at almost room temperature with the substrate not intentionally heated.

(Channel Layer)

As an amorphous oxide to form the channel layer used in the present invention, an amorphous semiconductor expressed by Equation 1 such as indium oxide, zinc oxide, tin oxide, indium tin oxide, indium zinc oxide, zinc tin oxide, or indium tin zinc oxide may be used.

$$((Sn_{1-x}M4_x)O_2)a \cdot ((In_{1-Y}M3_Y)_2O_3)b \cdot (Zn_{1-z}M2_zO)c \quad (1)$$

wherein $0 \leq x \leq 1$, $0 \leq Y \leq 1$, $0 \leq z \leq 1$, $0 \leq a \leq 1$, $0 \leq b \leq 1$, $0 \leq c \leq 1$, and $a+b+c=1$, M4 is a group IV element (Si, Ge, or Zr) having an atomic number smaller than that of Sn, M3 is a group III element (B, Al, Ga, or Y) having an atomic number smaller than that of In or is Lu, and M2 is a group II element (Mg or Ca) having an atomic number smaller than that of Zn.

Among them, in particular, ones expressed by Equation 2 or 3 below are preferable.

$$((In_{1-y}Ga_y)_2O_3)b \cdot ((ZnO))c \quad (2)$$

$0 \leq y \leq 1$, $0 \leq b \leq 1$, $0 \leq c \leq 1$, or $$(SnO_2)a \cdot ((In_2O_3)b \cdot ((ZnO))c \quad (3)$$

$0 \leq a \leq 1$, $0 \leq b \leq 1$, $0 \leq c \leq 1$

For example, when the composition is shown by a phase diagram, an amorphous oxide film can be materialized by a monocomponent, binary, or ternary composition located inside a triangle the vertices of which are $SnO_2$, $In_2O$, and ZnO.

Depending on the compositional ratio, the crystallized oxide film may be generated.

For example, among binary compositions (compositions located on sides of the above-mentioned triangle) containing two of the above-mentioned three compounds, an In—Zn—O-based one can form an amorphous film when the composition includes approximately 30 atom % or more of In.

In particular, when a gate insulating layer containing Ga as the main component is used, it is preferable to use a channel layer containing In (Zn or Sn) as the main component and containing Ga as the sub component.

In this case, in particular, a TFT exhibiting small hysteresis and excellent stability over time can be materialized.

The reason is uncertain, but may be that, owing to the insulating layer having the above-mentioned specified composition, the interface characteristics are improved, and as a result, charge is hardly trapped at the interface.

Another reason may be that, when interdiffusion of atoms (Ga, etc.) is caused between the insulating layer and the channel layer, the effect thereof on the transistor characteristics is small.

For example, when the composition is shown by a phase diagram, formation of the channel layer by a ternary composition located inside the triangle the vertices of which are $Ga_2O_3$, $In_2O_3$, and ZnO is a preferable example.

More specifically, the channel layer being formed of an amorphous oxide containing In, Ga, and Zn is a more preferable example.

In this way, when a material containing Ga such as an In—Ga—Zn—O-based material is used for the channel layer, because the insulating layer and the channel layer are based on the same material system, the transistor can be manufactured at a low cost, and loads on the environment is low.

The amorphous oxide has the following features.

More specifically, in an ordinary semiconductor, the electron mobility decreases as the carrier concentration increases due to scattering between carriers and the like. On the other hand, in the above-mentioned amorphous oxide semiconductor, the electron mobility increases as the electron carrier concentration increases.

When voltage is applied to the gate electrode, electrons can be injected into the above-mentioned amorphous oxide channel layer, a current flows between the source electrode and the drain electrode, and the transistor are switched into a ON state.

Because, in the amorphous oxide film, the electron mobility increases as the electron carrier concentration increases, the current in the ON state can be made still larger. More specifically, the saturation current and the on/off ratio can be made still larger.

The amorphous oxide film is preferably formed by a vapor phase method such as sputtering (SP), pulse laser deposition (PLD) and electron beam deposition.

It is to be noted that, among vapor phase methods, the SP is appropriate from the viewpoint of mass production.

However, the method of forming the film is not limited to those.

The temperature of the substrate when the film is formed can be maintained at almost room temperature with the substrate not intentionally heated.

When an amorphous oxide is used for the channel layer, in order to obtain satisfactory TFT characteristics, it is preferable to use an amorphous oxide having an electrical conductivity of 10 S/cm or less and 0.0001 S/cm or more.

In order to obtain the electrical conductivity as described above, depending on the composition of the material of the channel layer, it is preferable to form an amorphous oxide film having an electron carrier concentration of approximately $10^{14}$-$10^{18}$/cm$^3$.

When the electrical conductivity is 10 S/cm or more, a normally OFF transistor can not be formed, and the on/off ratio can not be made large.

In extreme cases, even if gate voltage is applied, the current between the source and drain electrodes is not switched on/off, and transistor operation is not observed. On the other hand, in the case of an insulator, in other words, when the electrical conductivity is 0.0001 S/cm or less, the ON current can not be made large.

In extreme cases, even if gate voltage is applied, the current between the source and drain electrodes is not switched on/off, and transistor operation is not observed.

Ordinarily, the electrical conductivity and the carrier concentration of an oxide are controlled by controlling the oxygen partial pressure at the time of forming the film.

More specifically, by controlling the oxygen partial pressure, the amount of oxygen vacancy in the thin film is mainly controlled, by which the electron carrier concentration is controlled.

Figure 7:
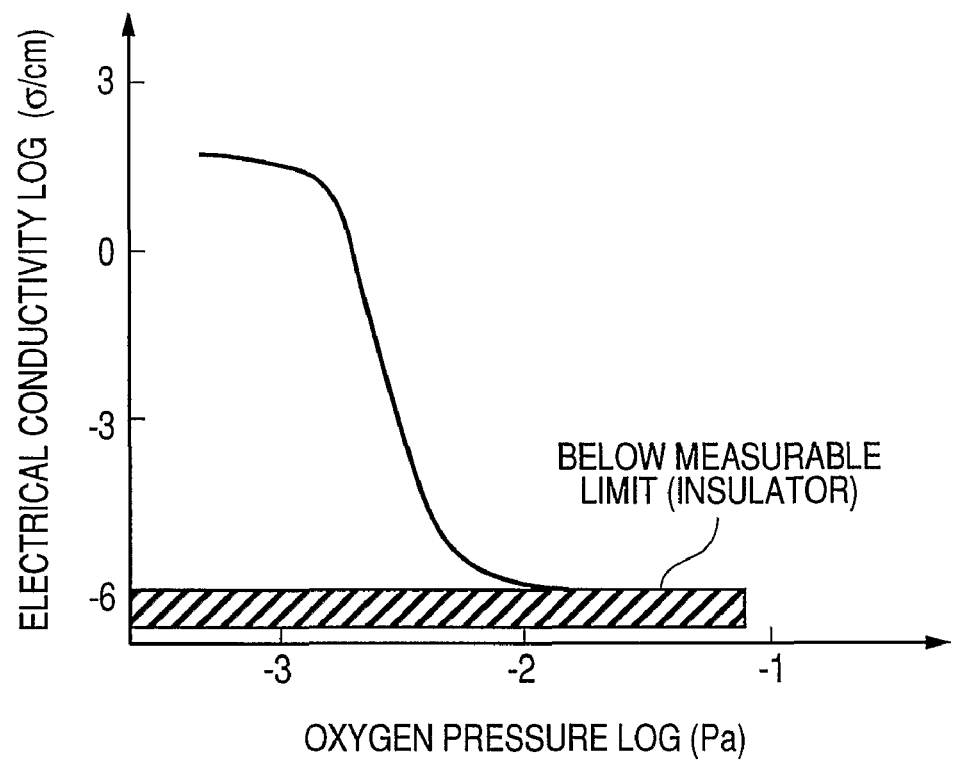
FIG. 7 is a graph illustrating exemplary dependence of electrical conductivity on oxygen partial pressure when an In—Ga—Zn—O-based oxide thin film is formed by sputtering.

FIG. 7 is a graph illustrating exemplary dependence of the carrier concentration on the oxygen partial pressure when an In—Ga—Zn—O-based oxide thin film is formed by sputtering.

In reality, by precisely controlling the oxygen partial pressure, a semi-insulating film which is an amorphous oxide film with a semi-insulating property having an electron carrier concentration of $10^{14}$-$10^{18}$/cm$^3$ can be obtained. By using the thin film as described above for the channel layer, a satisfactory TFT can be formed.

As illustrated in FIG. 7, by forming a film with an oxygen partial pressure of typically approximately 0.005 Pa, a semi-insulating thin film can be obtained.

When the oxygen partial pressure is 0.001 Pa or less, the formed thin film becomes an insulator, while, when the oxygen partial pressure is 0.01 Pa or more, the electrical conductivity is so high that the film is inappropriate for a channel layer of a transistor.

The materials of the source electrode 13, the drain electrode 14, and the gate electrode 15 are not particularly limited if satisfactory electrical conductivity and electric connection to the channel layer can be attained.

For example, a transparent conductive film of In$_2$O$_3$:Sn, ZnO, or the like, or a metal such as Au, Pt, Al, or Ni can be used.

As the substrate 10, a glass substrate, a plastic substrate, a plastic film, or the like can be used.

Because the above-mentioned channel layer and gate insulating layer are transparent to visible light, if a transparent material is used as a material of the above-mentioned electrode and the substrate, the thin film transistor can be made transparent.

(TFT Characteristics)

Figure 3:
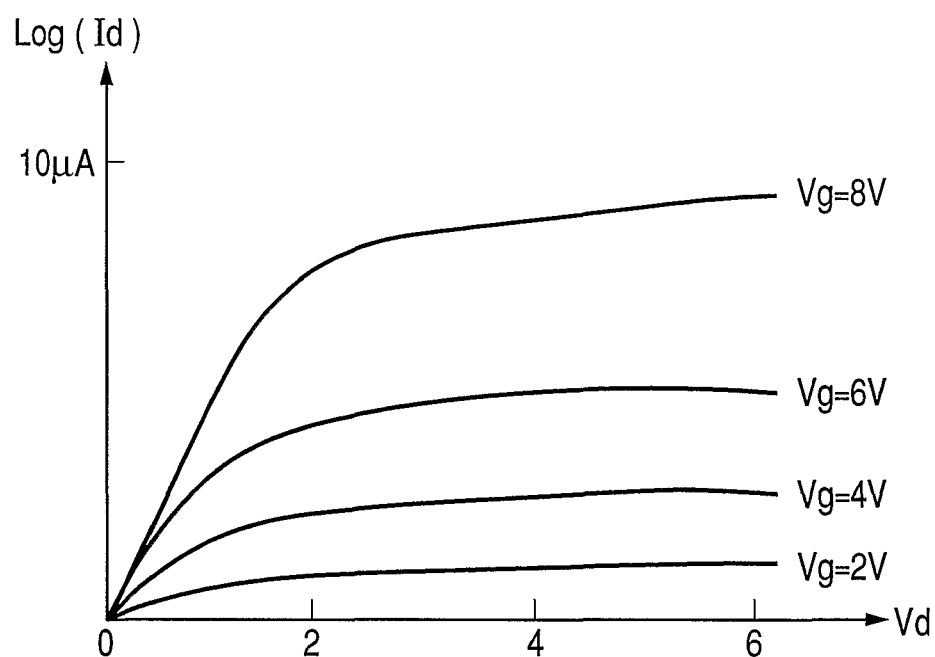
FIG. 3 is a graph illustrating typical characteristics of the field effect transistor according to the present invention.
Figure 4:
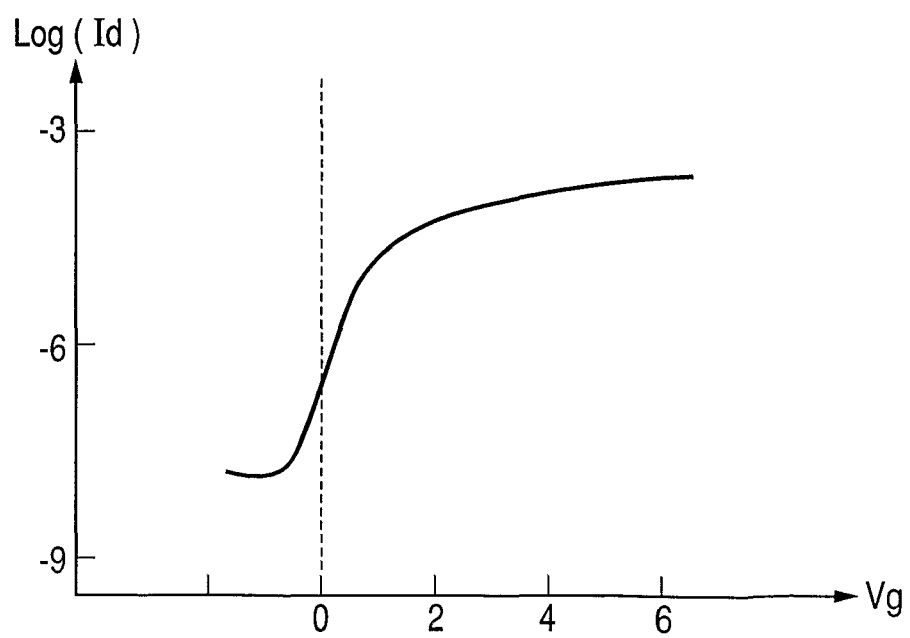
FIG. 4 is a graph illustrating typical characteristics of the field effect transistor according to the present invention.

FIG. 3 and FIG. 4 are graphs each illustrating typical characteristics of a field effect transistor according to the present invention.

When a voltage Vd of approximately 5 V is applied between the source and drain electrodes, modulation of the gate voltage Vg in the range of 0-5 V can control the current Id between the source and drain electrodes and switch the transistors between on and off state.

FIG. 3 illustrates exemplary Id-Vd characteristics with varying Vg, while FIG. 4 illustrates exemplary Id-Vg characteristics (transfer characteristics) when Vd is 6 V.

(Hysteresis)

Figure 5:
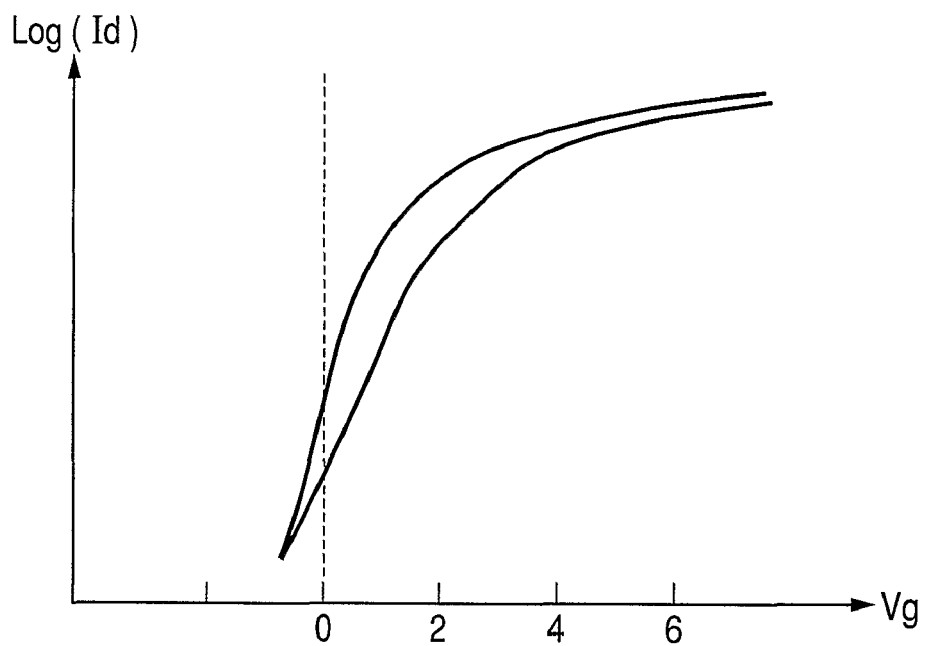
FIG. 5 is a graph illustrating hysteresis when an oxide containing Y as the main component is used for a gate insulating layer.
Figure 6:
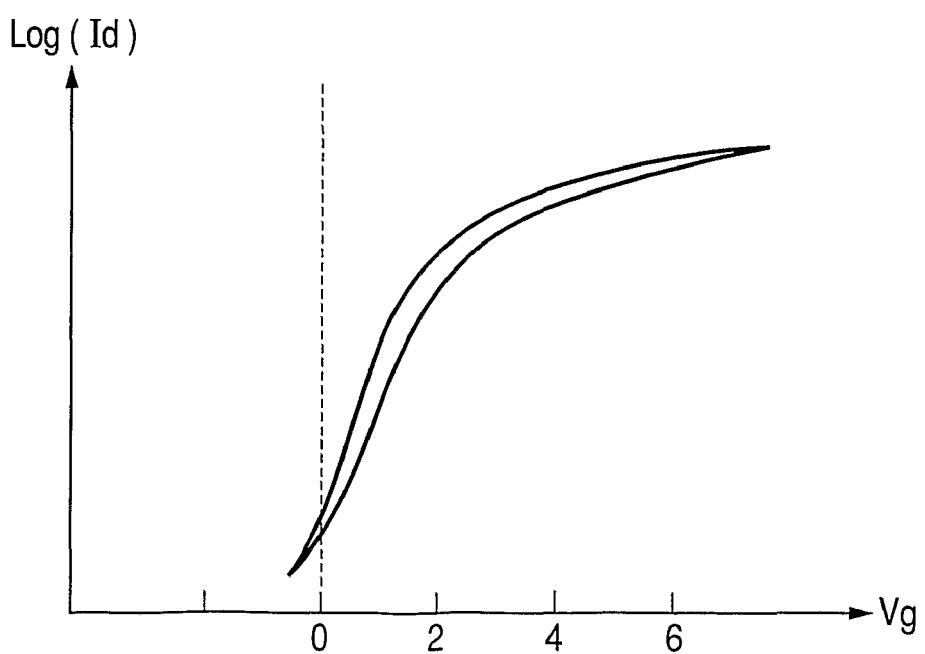
FIG. 6 is a graph illustrating hysteresis when an oxide containing Ga as a main component is used for the gate insulating layer.

FIG. 5 and FIG. 6 are used to describe hysteresis.

FIG. 5 is a graph illustrating hysteresis when an oxide containing Y as the main component is used for the gate insulating layer.

FIG. 6 is a graph illustrating hysteresis when an oxide containing Ga as the main component is used for the gate insulating layer.

"Hysteresis" refers to the characteristic that, in an evaluation of TFT transfer characteristics, when Vd is fixed and Vg is swept (up and down) as illustrated in FIG. 5 and FIG. 6, Id has different values between when the voltage goes up and when the voltage goes down.

Because, when the hysteresis is large, the value of Id obtained with regard to the predetermined Vg varies, a device with a small hysteresis is preferable.

When an oxide containing Y as the main component is used for the gate insulating layer, the device exhibits hysteresis characteristics as shown in FIG. 5.

Compared with this, when an amorphous oxide containing Ga as the main component is used for the gate insulating layer, a device having a small hysteresis can be obtained as shown in FIG. 6.

The physical reason is uncertain for the fact that the hysteresis is decreased by using an amorphous oxide containing Ga as the main component for the gate insulating layer, but it is assumed that an interface where carriers are less likely to be trapped is materialized between the channel layer and the insulating layer.

Although the present invention is described more specifically in the following based on examples, the present invention is by no means limited thereto.

EXAMPLE 1

Amorphous Ga$_2$O$_3$ Insulating Layer

In this example, the top-gate type TFT device illustrated in FIG. 1 was manufactured.

The TFT device had a channel layer formed of an In—Ga—Zn—O-based amorphous oxide and a gate insulating layer formed of amorphous Ga$_2$O$_3$.

First, an amorphous oxide film as the channel layer 11 was formed on the glass substrate 10 (Corning #1737).

In this example, the In—Zn—Ga—O-based amorphous oxide film was formed by radio-frequency sputtering in a mixed gas atmosphere of argon gas and oxygen gas.

Figure 8:
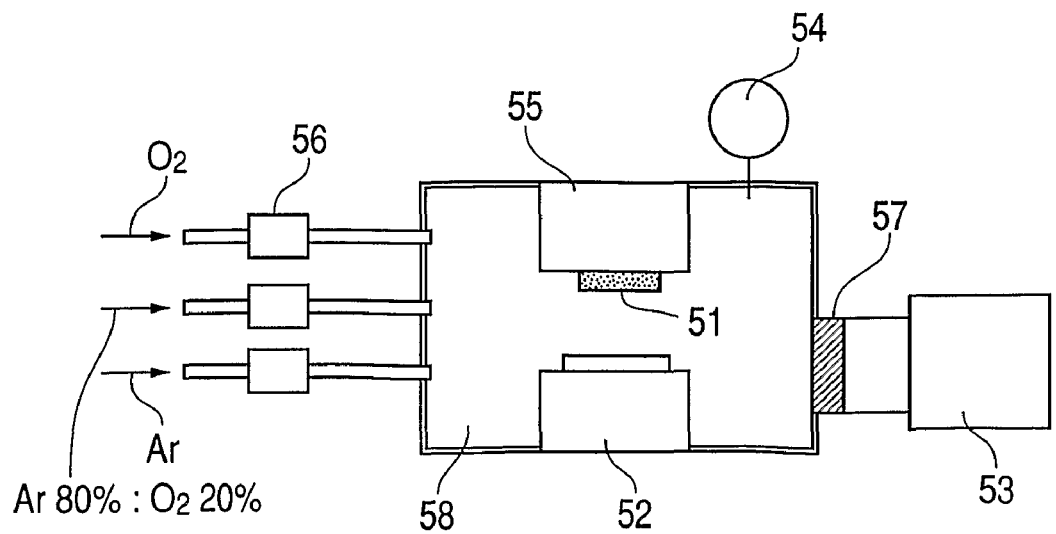
FIG. 8 is a high frequency sputtering apparatus used in an example of the present invention.

A sputtering apparatus as illustrated in FIG. 8 was used.

In FIG. 8, reference numerals 51, 52, 53, 54, 55, 56, 57, and 58 denote a sample, a target, a vacuum pump, a vacuum gauge, a substrate holding means, gas flow-rate control means provided for the respective gas introduction systems, a pressure-control means, and a film-forming chamber, respectively.

There were provided three gas introduction systems for argon, oxygen, and a mixed gas of argon and oxygen (Ar: $O_2$=80:20).

With the gas flow-rate control means 56 capable of independently controlling the flow rates of the respective gases and the pressure control means 57 for controlling the exhaust speed, a predetermined gas atmosphere was able to be obtained in the film forming chamber.

In this example, a polycrystalline sintered material having a composition of $InGaO_3$ (ZnO) having a size of two inches was used as the target (material source), and the applied RF power was 100 W.

The total pressure of the atmosphere when the film was formed was 0.4 Pa, where the gas flow ratio was Ar:$O_2$=100:1. The film formation rate was 12 nm/min, and the temperature of the substrate was 25° C.

With regard to the obtained film, when X-ray diffraction analysis (thin-film method, angle of incidence=0.5 degrees) was carried out on the film, no clear diffraction peak was detected, which shows that the manufactured In—Zn—Ga—O-based film was an amorphous film.

Further, as a result of pattern analysis using spectroscopic ellipsometry, it was found that the root-mean-square roughness (Rrms) of the thin film was approximately 0.5 nm and the film thickness thereof was approximately 60 nm.

As a result of X-ray fluorescence spectroscopy (XRF), the metal compositional ratio of thin film was In:Ga:Zn=38:37:25.

The electrical conductivity was approximately $10^{-1}$ S/cm, the electron carrier concentration was $4 \times 10^{16}$/cm$^3$, and the estimated electron mobility was approximately 2 cm$^2$/V·sec.

From light absorption spectrum analysis, the forbidden band-gap energy of the manufactured amorphous oxide film was approximately 3 eV.

Next, the drain electrode 14 and the source electrode 13 were formed and patterned using a photolithography and lift-off techniques. The material of the electrodes was Au and the thickness was 30 nm.

Then, the gate insulating layer 12 was formed and patterned using photolithography and lift-off.

The gate insulating film was a $Ga_2O_3$ film formed by high frequency RF sputtering, and the thickness thereof was 150 nm.

In this example, a sintered material of polycrystalline $Ga_2O_3$ having a size of two inches was used as the target (material source), and the applied RF power was 160 W.

The total pressure of the atmosphere when the film was formed was 0.4 Pa, where the gas flow ratio was Ar:$O_2$=100:5. The temperature of the substrate was 25° C.

With regard to the formed $Ga_2O_3$ film, the relative permittivity was measured to be approximately 9 and the dielectric strength was approximately 4 MV/cm.

In addition, X-ray diffraction confirmed that the thin film was amorphous.

Further, the gate electrode 15 was formed using a photolithography and lift-off techniques.

The channel length of the electrode was 50 µm while the channel width thereof was 200 µm. The material of the electrode was Au and the thickness was 30 nm.

COMPARATIVE EXAMPLE 1

The structure in Comparative Example 1 was similar to that of the above-mentioned example except for the gate insulating film. The gate insulating film was a $Y_2O_3$ film formed by sputtering, and the thickness thereof was 150 nm. The relative permittivity of the $Y_2O_3$ film was approximately 12. Further, X-ray diffraction confirmed that the film was a polycrystalline film.

COMPARATIVE EXAMPLE 2

The structure in Comparative Example 2 was similar to that of the above-mentioned example except for the gate insulating film. The gate insulating film was an $SiO_2$ film formed by sputtering, and the thickness thereof was 150 nm.

The relative permittivity of the $SiO_2$ film was approximately 4. Further, X-ray diffraction confirmed that the film was an amorphous film.

Evaluation of Characteristics of TFT Device

FIGS. 3 and 4 each illustrate exemplary current-voltage characteristics of the TFT device measured at room temperature. FIG. 3 illustrates the Id-Vd characteristics while FIG. 4 illustrates the Id-Vg characteristics.

As illustrated in FIG. 3, when a predetermined gate voltage Vg was applied and the dependence of the source-drain current Id on the drain voltage Vd with varying Vd was measured, behavior of a typical semiconductor transistor to show saturation (pinch off) at approximately Vd=6V was observed.

With regard to the gain characteristics, when Vd=4 V was applied, the threshold value of the gate voltage VG was approximately −0.5 V.

When Vg=10 V, the current Id was approximately $1.0 \times 10^{-5}$ A.

The on/off ratio of the transistor was more than $10^6$. Further, when the field effect mobility was calculated from the output characteristics, the field effect mobility of approximately 9 cm$^2$(Vs)$^{-1}$ was obtained in a saturation region.

The manufactured device was irradiated with visible light and the same measurement was made. No change in the transistor characteristics was observed.

Further, the characteristics of the TFT of this example are characterized in that the exhibited hysteresis is smaller than that of the TFT of Comparative Example 1.

FIG. 5 and FIG. 6 are graphs of Id-Vg of this example and the comparative example, respectively, for comparison. FIG. 5 illustrates exemplary TFT characteristics of Comparative Example 1 while FIG. 6 illustrates exemplary TFT characteristics of this example.

By using amorphous $Ga_2O_3$ for the gate insulating layer in this way, the hysteresis of the TFT can be decreased.

Further, a TFT is superior in stability to comparative Example 1, although having a somewhat smaller ON current can be materialized. This is because the permittivity of the insulating layer is lower than that of Comparative Example 1.

On the other hand, because the permittivity of the gate insulating layer of this example is higher than that of Comparative Example 2, a larger ON current can be obtained.

Although the hysteresis was comparable, there was a tendency that change in the characteristics after operation over a long period of time was small.

As described before, it can be supposed that the TFT excellent in stability can be materialized because the main component of the gate insulating layer is Ga.

In this way, by using the gate insulating layer formed of an amorphous oxide containing Ga as the main component, a transistor having a relatively large ON current and exhibiting small hysteresis can be materialized.

The field effect transistor with a relatively high field effect mobility of this example is expected to be used in a driving circuit of an organic light-emitting diode and the like.

EXAMPLE 2

Amorphous Ga—In—O Insulating Layer

In this example, a top gate type TFT device illustrated in FIG. 1 was manufactured.

An amorphous oxide containing Ga as the main component and containing In as the sub component was used as the gate insulating layer.

First, an In—Zn—Ga—O-based amorphous oxide film was deposited on a glass substrate (Corning #1737) by a PLD method using a KrF excimer laser.

The In—Zn—Ga—O-based amorphous oxide film was deposited with a polycrystalline sintered material having a composition of $InGaO_3$ $(ZnO)$ 4 used as the target. The oxygen partial pressure when the film was formed was 6 Pa.

It is to be noted that the power of the KrF excimer laser was $1.5 \times 10^{-3}$ mj/cm²/pulse, the pulse width was 20 nsec, and the repetition frequency was 10 Hz. Further, the temperature of the substrate was 25° C.

As a result of X-ray fluorescence spectroscopy (XRF), the metal compositional ratio of the thin film was In:Ga:Zn=0.97:1.03:4.

Further, as a result of pattern analysis using spectroscopic ellipsometry, the root-mean-square roughness (Rrms) of the thin film was approximately 0.6 nm and the film thickness thereof was approximately 60 nm. The resistivity of the thin film was evaluated and a semi-insulating property of approximately 50 Ωcm was exhibited.

With regard to the obtained film, when X-ray diffraction (thin film method, angle of incidence=0.5 degrees) was carried out on the film, no clear diffraction peak was detected, and thus, the manufactured In—Zn—Ga—O-based film was an amorphous film.

The drain electrode 14 and the source electrode 13 were formed and patterned using a photolithography and lift-off techniques. The material of the electrodes was Au and the thickness thereof was 30 nm.

Then, the gate insulating layer 12 was formed and patterned using a photolithography and lift-off techniques. The gate insulating film was a Ga—In—O film formed by PLD. The thickness of the film was 150 nm.

As a result of X-ray fluorescence spectroscopy (XRF), the metal compositional ratio of the thin film was Ga:In=90:10.

With regard to the formed $Ga_2O_3$ film, the relative permittivity was measured to be approximately 10 and the dielectric strength was approximately 3 MV/cm. In addition, X-ray diffraction confirmed that the thin film was amorphous.

Further, the gate electrode 15 was formed using a photolithography and lift-off techniques. The material of the electrode was Au and the thickness thereof was 50 nm. The channel length of the electrode was 50 μm while the channel width thereof was 200 μm.

Evaluation of Characteristics of TFT Device

The thin film transistor of this example exhibited behavior of a typical semiconductor transistor to show saturation (pinch off) at approximately Vd=6V. The on/off ratio of the transistor was more than $10^6$, and the field effect mobility was approximately 7 cm² $(Vs)^{-1}$.

Further, the TFT of this example is characterized in that the exhibited hysteresis is still smaller than that of Example 1.

It is possible to consider that the TFT excellent in stability can be materialized because the gate insulating layer is formed of an amorphous oxide containing Ga as the main component and containing In as the sub component.

EXAMPLE 3

Amorphous Ga—Hf—O Insulating Layer

In this example, a top gate type TFT device illustrated in FIG. 1 was manufactured.

An amorphous oxide containing Ga as the main component and containing Hf as the sub component was used as the gate insulating layer.

The method of manufacturing the TFT of this example and the structure thereof were similar to those of Example 1 except for the gate insulating layer.

The gate insulating film was an amorphous Ga—Hf—O film formed by RF sputtering. The thickness of the film was 150 nm.

In this example, a sintered material formed of a mixture of polycrystalline $Ga_2O_3$ and $HfO_2$ having a size of two inches was used as the target (material source), and the applied RF power was 160 W.

The total pressure of the atmosphere when the film was formed was 0.4 Pa, where the gas flow ratio was $Ar:O_2$=100:5. The temperature of the substrate was 25° C.

As a result of X-ray fluorescence spectroscopy (XRF), the metal compositional ratio of the thin film was Ga:Hf=64:36. With regard to the formed $Ga_2O_3$ film, the relative permittivity was measured to be approximately 11 and the dielectric strength was approximately 3 MV/cm.

Evaluation of Characteristics of TFT Device

The thin film transistor of this example exhibited behavior of a typical semiconductor transistor to show saturation (pinch off) at approximately Vd=6V. The on/off ratio of the transistor was more than $10^6$, and the field effect mobility was approximately 8 cm² $(Vs)^{-1}$.

Further, the TFT of Example 3 is characterized in that, because a material having a higher permittivity compared with that of Example 1 was used for the gate insulating layer, a still larger ON current can be obtained.

This is because, by using the gate insulating layer containing Hf as the sub component, the permittivity of the gate insulating layer can be made higher.

The hysteresis was smaller than that of Comparative Example 1, and approximately comparable to that of Example 1.

It is possible to consider the TFT excellent in stability can be materialized because the amorphous oxide containing Ga as the main component is used for the gate insulating layer.

The field effect transistor having a relatively large ON current of this example is expected for use of an organic light-emitting diode in an operation circuit and the like.

EXAMPLE 4

Bottom Gate Structure Ga—Si—O Insulating Layer

In this example, a bottom gate type TFT device illustrated in FIG. 2 was manufactured.

Further, an amorphous oxide containing Ga as the main component was used for the gate insulating layer.

First, the gate electrode 15 formed of Ta was formed on the glass substrate 10 in a thickness of 200 nm by sputtering deposition. Patterning was carried out using a photolithography and dry etching techniques.

Then, as the gate insulating layer 12, a laminated film of $SiN_x$ and Ga—Si—O was formed. Using plasma CVD, an insulating layer formed of $SiN_x$ at a thickness of 100 nm was formed.

Next, a Ga—Si—O insulating layer having a thickness of 50 nm was laminated by sputtering.

A sintered material formed of a mixture of polycrystalline $Ga_2O_3$ and $SiO_2$ having a size of two inches was used as the target (material source), and the applied RF power was 150 W. The total pressure of the atmosphere when the film was formed was 0.4 Pa, where the gas flow ratio was $Ar:O_2$=100:5. The temperature of the substrate was 25° C.

The metal compositional ratio of the thin film was approximately Ga:Si=6:4.

The insulating layer formed by laminating the two layers had a relative permittivity equivalent to that of approximately 8 in terms of an uniform layer. The dielectric strength of the layer was approximately 6 MV/cm. Further, X-ray diffraction confirmed that the thin film was amorphous.

Then, the channel layer formed of an In—Sn—O based oxide was formed. In this example, the method of forming the channel layer was similar to that of Example 1. The metal compositional ratio was approximately In:Sn=4:6.

Evaluation of Characteristics of TFT Device

The TFT of this example tends to have less variation in the characteristics when a plurality of devices are formed compared with the case of Comparative Example 1.

The on/off ratio of the transistor was more than $10^6$, and the field effect mobility was approximately 6 $cm^2(Vs)^{-1}$.

Because the gate insulating layer of the TFT of this example has a high dielectric strength, even if it is driven with high gate voltage applied thereto, stable operation is possible.

The hysteresis was as small as that of Example 1, which was satisfactory.

On the other hand, the stability of the TFT when driven over an long period of time was satisfactory compared with those of Comparative Examples 1 and 2, but was somewhat inferior to those of Examples 1 and 2.

It is considered that Examples 1 and 2 provide excellent stability because both the channel layer and the gate insulating layer contain Ga in the respective examples.

In other words, the interface between the gate insulating layer and the channel layer is supposed to be stable when the TFT is driven over a long period of time.

EXAMPLE 5

Plastic Substrate

In this example, a top gate type TFT device illustrated in FIG. 1 was manufactured on a plastic substrate.

An amorphous oxide containing Ga as the main component and containing Zn as the sub component was used as the gate insulating layer.

The method of manufacturing and the structure were similar to those of Example 1.

However, as the substrate, a polyethylene terephthalate (PET) film was used.

The channel layer was formed of an In—Ga—Zn—O film in a thickness of 50 nm, and the metal element compositional ratio was In:Ga:Zn=2:2:6. The film was formed by RF sputtering. A sintered material formed of a mixture of $In_2O_3$, $Ga_2O_3$, and ZnO having a size of two inches was used as the target (material source), and the applied RF power was 100 W.

The total pressure of the atmosphere when the film was formed was 0.4 Pa, where the gas flow ratio was $Ar:O_2$=100:1. The temperature of the substrate was 25° C.

However, the gate insulating film was formed of an In—Ga—Zn—O film having a thickness of 200 nm, and the metal element compositional ratio was In:Ga:Zn=0.9:8:1.1. The film was formed by RF sputtering.

A sintered material formed of a mixture of $In_2O_3$, $Ga_2O_3$, and ZnO having a size of two inches was used as the target (material source), and the applied RF power was 100 W.

Because compositional ratio of the target was different from that when the channel layer was formed, a thin film containing Ga as the main component was formed.

The total pressure of the atmosphere when the film was formed was 0.4 Pa, where the gas flow ratio was $Ar:O_2$=100:2. The temperature of the substrate was 25° C.

The source electrode, the drain electrode, and the gate electrode each were a transparent conductive film formed of an In—Zn—O film. The compositional ratio of metal elements was In:Zn=9:1. The thickness thereof was 100 nm. The film was formed by RF sputtering.

A sintered material formed of a mixture of $In_2O_3$ and ZnO having a size of two inches was used as the target (material source), and the applied RF power was 50 W. The atmosphere when the film was formed was Ar, and the total pressure of the atmosphere was 0.5 Pa. The temperature of the substrate was 25° C.

Evaluation of Characteristics of TFT Device

The TFT formed on the PET film was subjected to measurement at room temperature. The on/off ratio of the transistor was more than $10^3$. The field effect mobility was calculated to be about 3 $cm^2(Vs)^{-1}$. Further, the TFT had satisfactory hysteresis characteristics comparable to that of Example 1.

The device formed on the PET film was bent with a radius of curvature of 30 mm, and the same measurement of transistor characteristics was performed. No remarkable change in the transistor characteristics was observed. Further, the device was irradiated with visible light and the same measurement was performed, and no change in the transistor characteristics was observed.

The thin film transistor formed in this example was transparent to visible light, and was formed on a flexible substrate.

Because the channel layer, the gate insulating layer, and the electrodes of the TFT of this example are formed based on the material of the same material system, the TFT is characterized in that loads on the environment is low.

According to the present invention, because thin films can be formed at a low temperature and the materials are amorphous, a TFT can be formed on a flexible material including a PET film. More specifically, switching under a bent state is possible. Further, because the TFT is transparent to visible light and infrared light having a wavelength of 400 nm or more, it can be applied as a switching device of an LCD or an organic EL display. It can be applied to a wide range of products including a flexible display, a see-through display, an IC card, and an ID tag.

According to the present invention, a thin film transistor exhibits excellent TFT characteristics as well as an excellent operation stability.

In particular, a transistor having a small gate leak current and a relatively large ON current can be materialized.

Further, the transistor exhibits small hysteresis as well as excellent stability over time when driven.

This application claims priority from Japanese Patent Application No. 2006-020983 filed on Jan. 30, 2006, which is incorporated hereinto by reference.

The invention claimed is:

1. A field effect transistor that includes a gate electrode, a source electrode, and a drain electrode, the field effect transistor comprising:
   a channel layer formed of an amorphous oxide semiconductor that includes In, Zn, and Ga; and
   a gate insulating layer arranged between the channel layer and the gate electrode,
   wherein the gate insulating layer is formed of an amorphous oxide that includes Ga as a main component and includes In and Zn.

2. A field effect transistor according to claim 1, wherein the amorphous oxide includes at least one element selected from a group consisting of In, Zn, and Sn.

3. A field effect transistor according to claim 1, wherein the amorphous oxide includes at least one element selected from a group consisting of Ti, Hf, Zr, Y, La, Nb, and Ta.

4. A field effect transistor according to claim 1,
   wherein the channel layer is formed of an amorphous oxide expressed by (1):

$$((Sn_{1-x}M4_x)O_2)a \cdot ((In_{1-Y}M3_Y)_2O_3)b \cdot (Zn_{1-z}M2_zO)c \qquad (1),$$

wherein $0 \leq x \leq 1$, $0 \leq Y \leq 1$, $0 \leq z \leq 1$, $0 \leq a \leq 1$, $0 \leq b \leq 1$, $0 \leq c \leq 1$, and $a+b+c=1$,
   wherein M4 is a Periodic Table Group IV element (Si, Ge, or Zr) having an atomic number smaller than that of Sn,
   wherein M3 is a Periodic Table Group III element (B, Al, Ga, or Y) having an atomic number smaller than that of In or is Lu, and
   wherein M2 is a Periodic Table Group II element (Mg or Ca) having an atomic number smaller than that of Zn.

5. A field effect transistor according to claim 4, wherein the channel layer is formed of an amorphous oxide expressed by one of (2) and (3):

$$((In_{1-y}Ga_y)_2O_3)b \cdot ((ZnO))c \qquad (2),$$

wherein $0 \leq y \leq 1$, $0 \leq b \leq 1$, $0 \leq c \leq 1$, $$(SnO_2)a \cdot ((In_2O_3)b \cdot ((ZnO))c \qquad (3),$$

wherein $0 \leq a \leq 1$, $0 \leq b \leq 1$, $0 \leq c \leq 1$.

6. A field effect transistor according to claim 5, wherein the channel layer is formed of an amorphous oxide that includes In as a main component and Ga as a sub component.

7. A field effect transistor that includes a gate electrode, a source electrode, and a drain electrode, the field effect transistor comprising:
   a channel layer formed of an amorphous oxide semiconductor that includes In as a main component and includes Zn and Ga; and
   a gate insulating layer arranged between the channel layer and the gate electrode,
   wherein the gate insulating layer is formed of an amorphous oxide that includes Ga as a main component and includes In as a sub component.

* * * * *